(12) United States Patent
Tseng et al.

(10) Patent No.: US 11,640,184 B2
(45) Date of Patent: May 2, 2023

(54) PHASE SYNCHRONIZED LO GENERATION

(71) Applicant: MEDIATEK INC., Hsinchu (TW)

(72) Inventors: Chien-Wei Tseng, Hsinchu (TW); Mohammed Fathey Abdelfattah Hassan, Cambridge (GB); Li-Shin Lai, Hsinchu (TW); Tzu-Yu Yeh, Hsinchu (TW); Ming-Da Tsai, Hsinchu (TW); Bernard Mark Tenbroek, Cambridge (GB)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 16/918,601

(22) Filed: Jul. 1, 2020

(65) Prior Publication Data

US 2021/0004042 A1    Jan. 7, 2021

Related U.S. Application Data

(60) Provisional application No. 62/869,149, filed on Jul. 1, 2019.

(51) Int. Cl.
    *G06F 1/12*    (2006.01)
    *G06F 1/10*    (2006.01)
    *H03K 3/037*   (2006.01)

(52) U.S. Cl.
    CPC .................. *G06F 1/12* (2013.01); *G06F 1/10* (2013.01); *H03K 3/037* (2013.01)

(58) Field of Classification Search
    CPC .... G06F 1/06; G06F 1/10; G06F 1/12; H03K 3/037
    See application file for complete search history.

(56) References Cited

U.S. PATENT DOCUMENTS

| | | | |
|---|---|---|---|
| 6,611,158 B2 * | 8/2003 | Ehmann | G06F 1/24 327/142 |
| 7,719,317 B2 | 5/2010 | Chueh et al. | |

(Continued)

FOREIGN PATENT DOCUMENTS

| | | |
|---|---|---|
| EP | 1 415 217 A2 | 5/2004 |
| TW | 201814314 A | 4/2018 |

OTHER PUBLICATIONS

Taiwanese Office Action and Search Report dated Jun. 28, 2021 in Taiwanese Patent Application No. 109131105, 3 pages.

(Continued)

*Primary Examiner* — Ryan Johnson
*Assistant Examiner* — Colleen J O Toole
(74) *Attorney, Agent, or Firm* — Oblon, McClelland, Maier & Neustadt, L.L.P.

(57) ABSTRACT

Aspects of the disclosure provide methods and apparatuses for generating an internal reset signal that is synchronous to a clock signal. In some embodiments, an apparatus includes a clock switch circuit and a plurality of serially coupled D flip-flops (DFFs). The clock switch circuit receiving the clock signal can output the clock signal in an on state and block the clock signal in an off state. The plurality of serially coupled DFFs are coupled to the clock switch circuit and driven by the clock signal. If an external reset signal is enabled, the plurality of serially coupled DFFs can enable the internal reset signal. If the external reset signal is disabled, after a predefined number of clock signal cycles, the plurality of serially coupled DFFs can disable the internal reset signal.

20 Claims, 14 Drawing Sheets

(56) References Cited

U.S. PATENT DOCUMENTS

| | | | |
|---|---|---|---|
| 8,340,619 B1 | 12/2012 | Shirvani-Mahdavi et al. | |
| 8,384,435 B2* | 2/2013 | Langadi | H03K 5/19 |
| | | | 327/99 |
| 8,773,180 B2* | 7/2014 | Jang | H03K 3/011 |
| | | | 327/143 |
| 9,225,507 B1 | 12/2015 | Lye et al. | |
| 9,356,769 B2* | 5/2016 | Lin | H04B 1/403 |
| 2005/0253638 A1 | 11/2005 | Dietrich et al. | |
| 2009/0115467 A1* | 5/2009 | Kwon | G06F 1/06 |
| | | | 327/117 |
| 2009/0315771 A1 | 12/2009 | Zolfaghari | |
| 2011/0185216 A1 | 7/2011 | Zhao et al. | |
| 2014/0118033 A1* | 5/2014 | Anker | G06F 1/04 |
| | | | 327/142 |
| 2014/0192565 A1 | 7/2014 | Wang | |
| 2019/0089341 A1 | 3/2019 | Nagayama | |

OTHER PUBLICATIONS

European Search Report dated Jun.21, 2022 in corresponding European Patent Application No. 20188261.0, 8 pages.

* cited by examiner

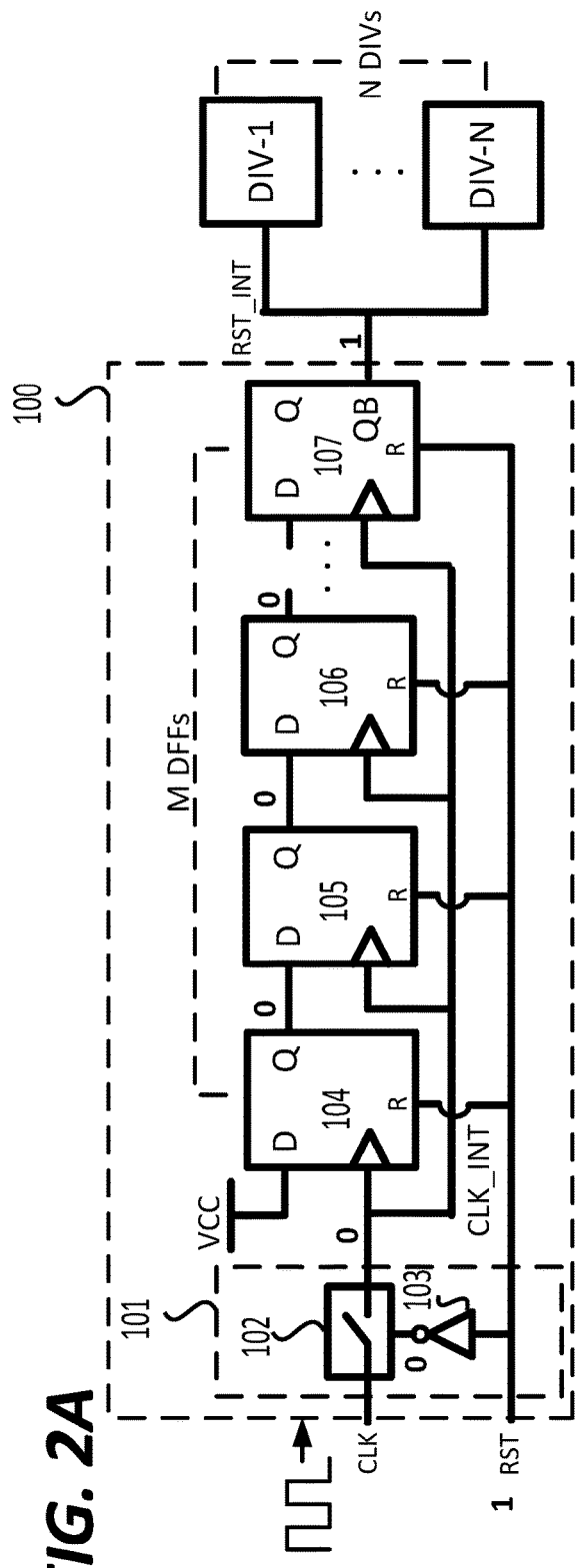
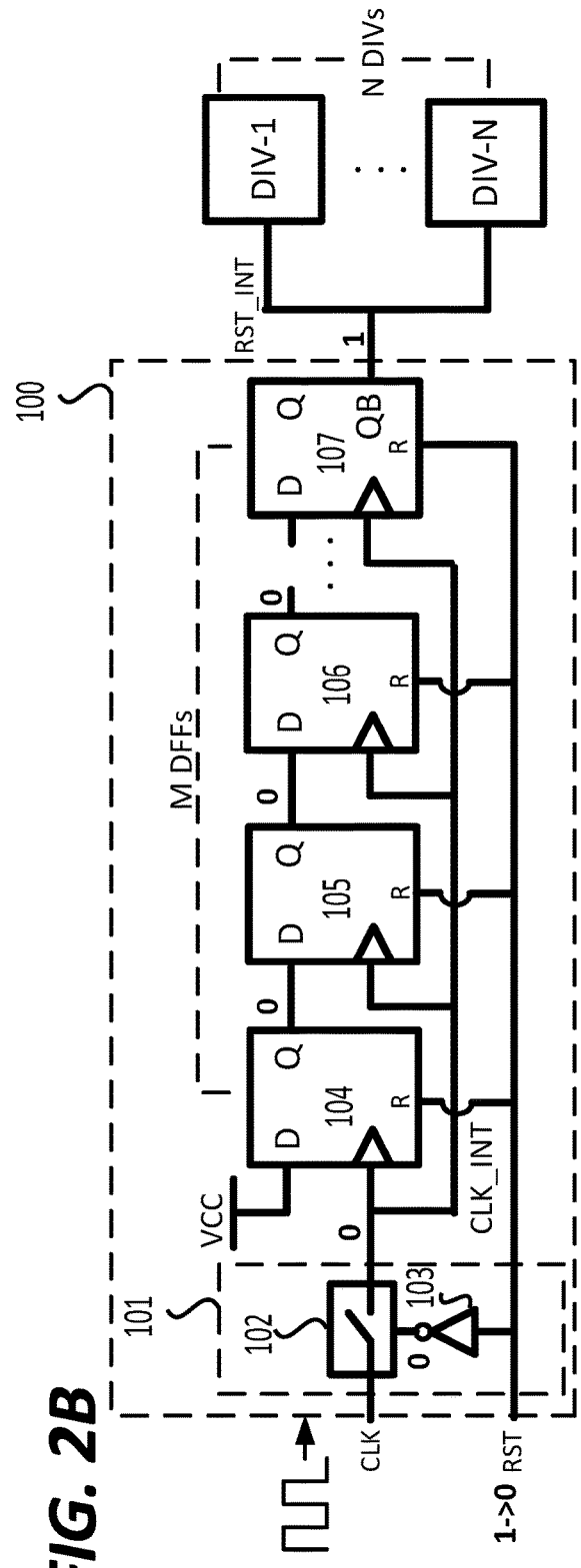
*FIG. 2A*
*FIG. 2B*

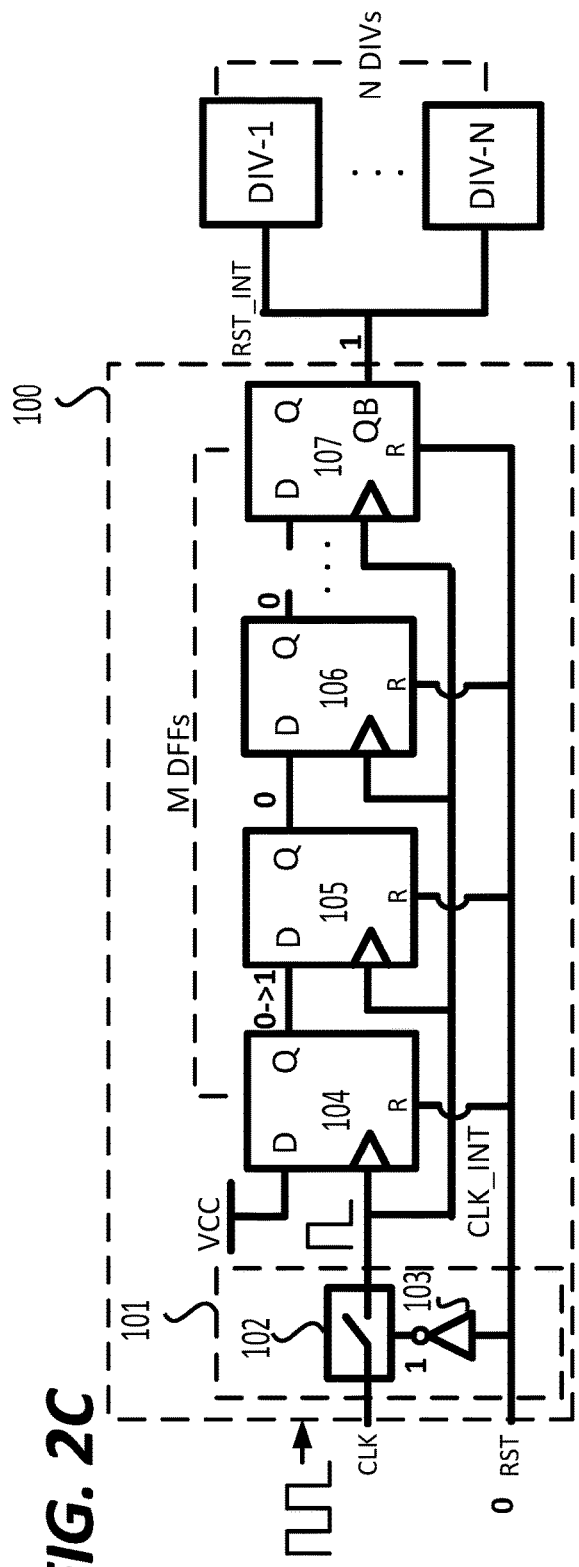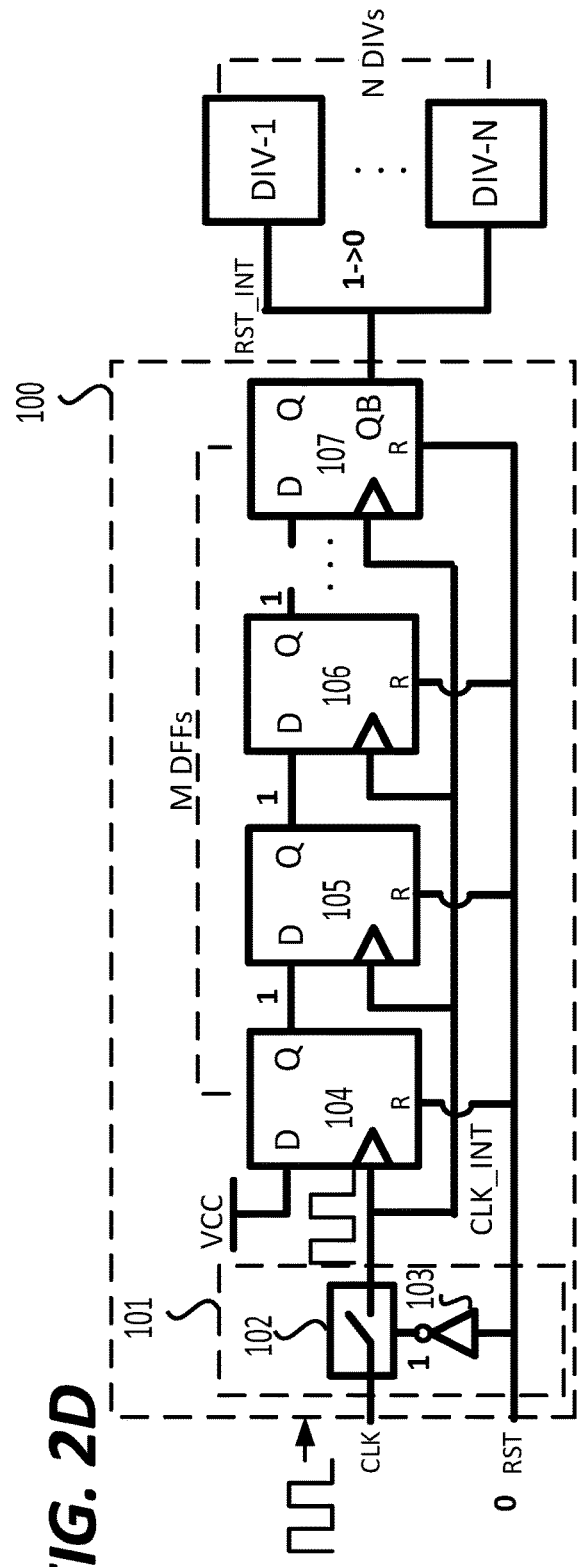

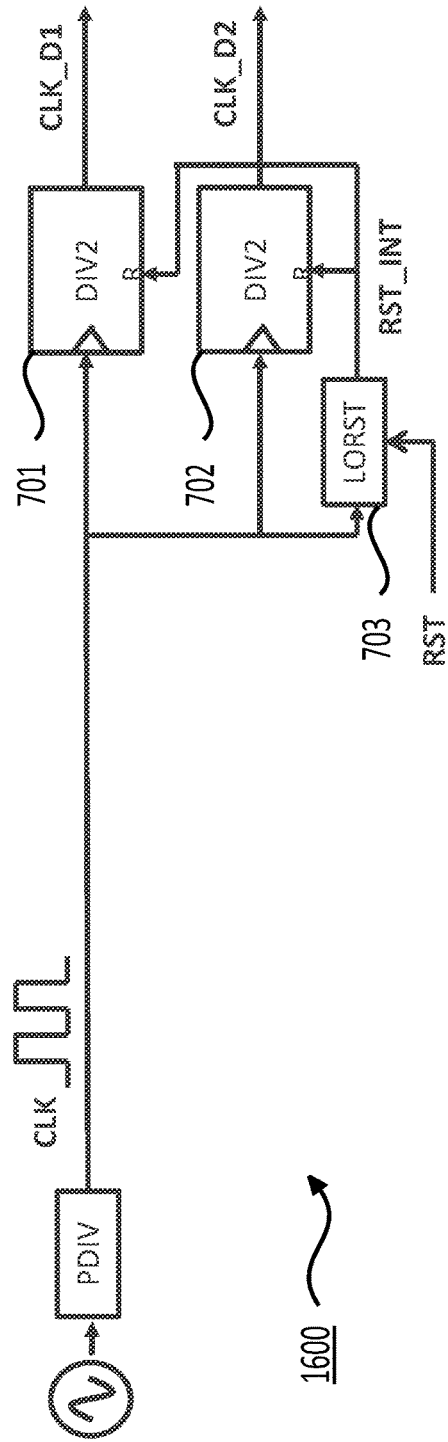
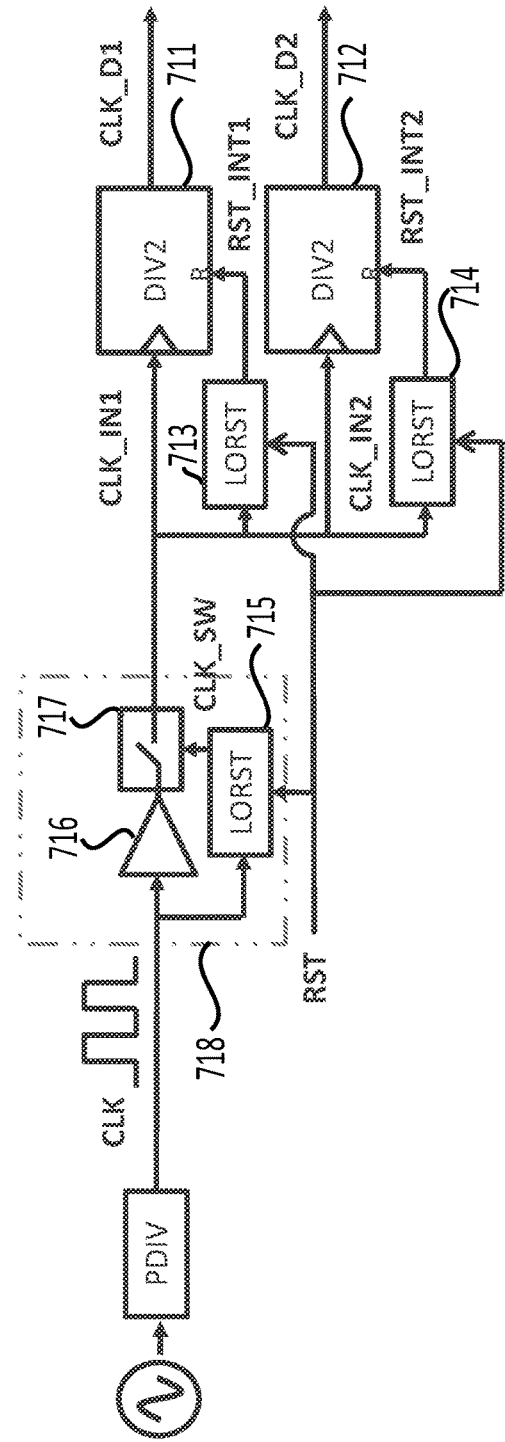
FIG. 7A
FIG. 7B

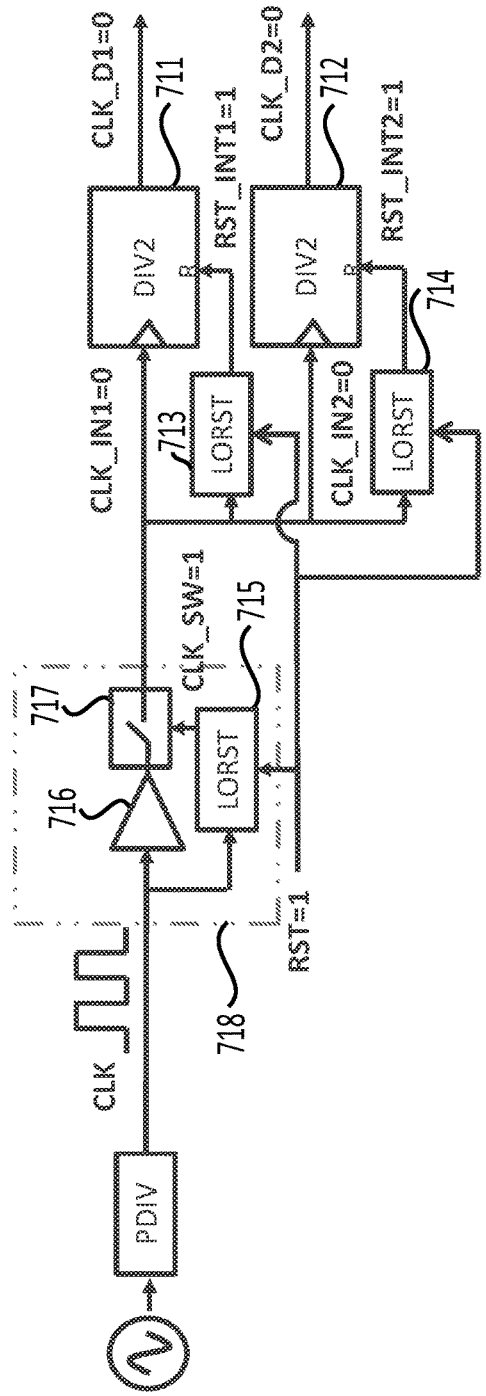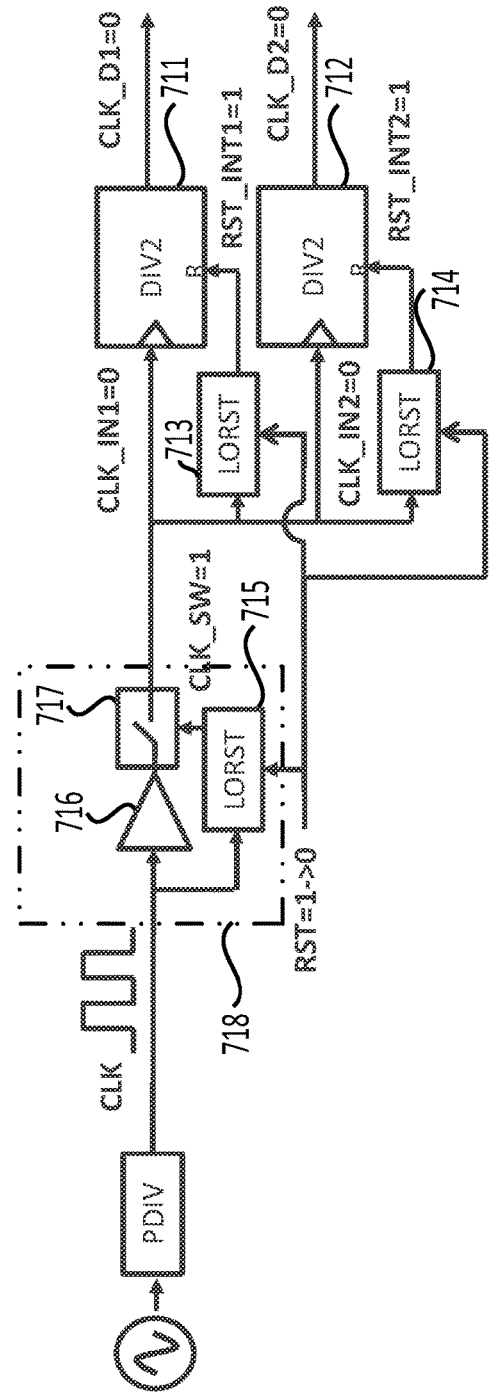
FIG. 8A
FIG. 8B

PHASE SYNCHRONIZED LO GENERATION

INCORPORATION BY REFERENCE

This present disclosure claims the benefit of U.S. Provisional Application No. 62/869,149, "PHASE SYNCHRONIZED LO GENERATION" filed on Jul. 1, 2019, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A transceiver may have multiple transmitter (TX) paths. Each path may have its own local oscillator (LO), which may be generated from a divide-by-2 (Div2) frequency divider associated with the path. Although these frequency dividers can output the same frequency LO, the phases of these LO may be different and varied, which may cause a meta-stability issue. In order to avoid the meta-stability issue, it may be desirable to synchronize different dividers so that their phase difference can be kept constant.

SUMMARY

Aspects of the disclosure provide an apparatus for controlling an internal reset signal that is synchronous to a clock signal. The apparatus includes a clock switch circuit and a plurality of serially coupled D flip-flops (DFFs). The clock switch circuit receiving the clock signal can output the clock signal in an on state and block the clock signal in an off state. The plurality of serially coupled DFFs are coupled to the clock switch circuit and driven by the clock signal. In response to an external reset signal being enabled, the plurality of serially coupled DFFs can enable the internal reset signal. After a predefined number of clock signal cycles after the external reset signal is disabled, the plurality of serially coupled DFFs can disable the internal reset signal.

In an embodiment, a data terminal of a first DFF in the plurality of DFFs is coupled to a logic voltage at which the internal reset signal is enabled, and an inverse output terminal of a last DFF in the plurality of DFFs is coupled to the internal reset signal.

In an embodiment, an input terminal of the clock switch circuit is coupled to the clock signal, an output terminal of the clock switch circuit is coupled to a clock terminal of each DFF in the plurality of DFFs, and a control terminal of the clock switch is coupled to the external reset signal.

In an embodiment, the clock switch circuit is in the off state so that the clock signal is not output to the plurality of DFFs in response to the external reset signal being enabled, and in the on state so that the clock signal is output to the plurality of DFFs in response to the external reset signal being disabled.

In an embodiment, the external reset signal is coupled to a reset terminal of each DFF in the plurality of DFFs.

In an embodiment, each DFF is set in a reset mode and in a standby mode in response to the external reset signal being enabled and disabled, respectively.

In an embodiment, the predefined number of clock signal cycles is dependent on a total number of DFFs.

Aspects of the disclosure also provide a method for controlling an internal reset signal that is synchronous to a clock signal. In the method, the clock signal is received through a clock switch circuit that is configured to output the clock signal in an on state and block the clock signal in an off state. The internal reset signal is enabled through a plurality of serially coupled D flip-flops (DFFs) in response to an external reset signal being enabled, and disabled through the plurality of serially coupled DFFs after a predefined number of clock signal cycles after the external reset signal is disabled. The plurality of serially coupled DFFs are coupled to the clock switch circuit and driven by the clock signal.

Aspects of the disclosure also provide an electronic system including a local divider reset (LORST) circuitry. The LORST circuitry receives a clock signal through a clock switch circuit that is configured to output the clock signal in an on state and block the clock signal in an off state. The LORST circuitry enables an internal reset signal through a plurality of serially coupled D flip-flops (DFFs) in response to an external reset signal being enabled, and disables the internal reset signal through the plurality of serially coupled DFFs after a predefined number of clock signal cycles after the external reset signal is disabled. The plurality of serially coupled DFFs are coupled to the clock switch circuit and driven by the clock signal.

BRIEF DESCRIPTION OF THE DRAWINGS

Various embodiments of this disclosure that are proposed as examples will be described in detail with reference to the following figures, wherein like numerals reference like elements, and wherein:

FIGS. 2A-2D show detailed operations of the LORST circuitry according to an embodiment of the disclosure;

FIG. 7A shows an exemplary local LORST configuration according to an embodiment of the disclosure;

FIG. 7B shows an exemplary cascade LORST configuration according to an embodiment of the disclosure;

FIGS. 8A-8D show detailed operations of the cascade LORST configuration according to an embodiment of the disclosure;

DETAILED DESCRIPTION OF EMBODIMENTS

Figure 1:
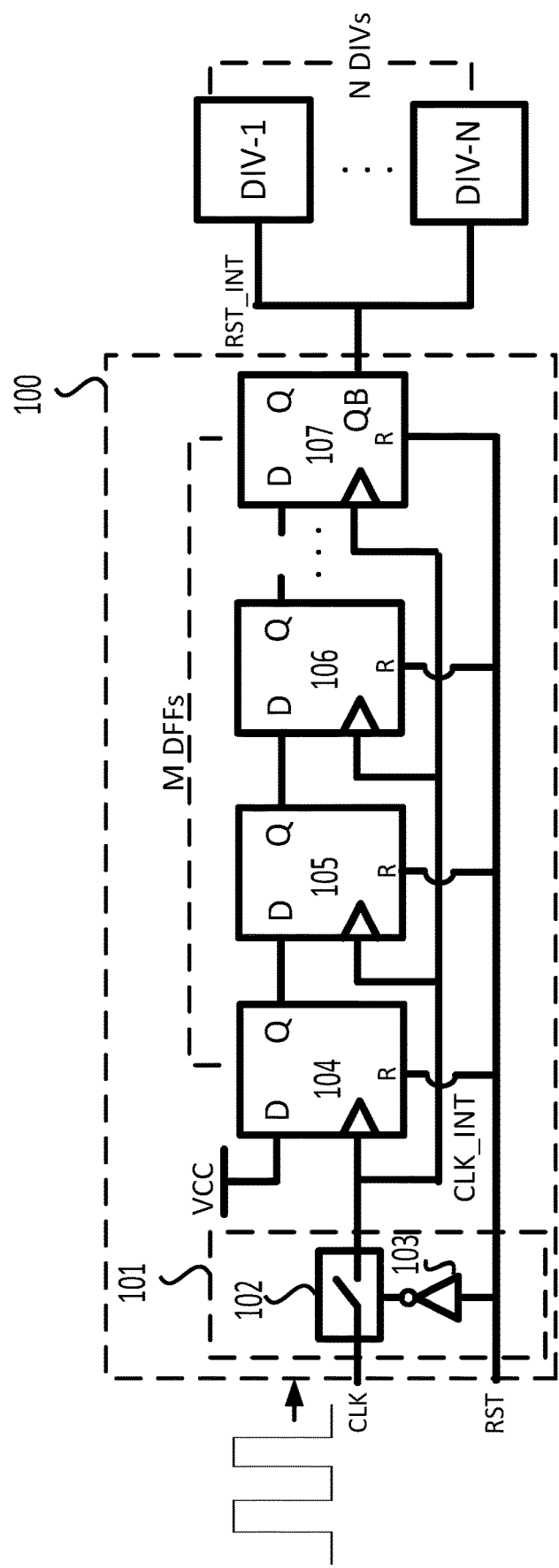
FIG. 1 shows an exemplary local divider reset (LORST) circuitry according to an embodiment of the disclosure.

FIG. 1 shows an exemplary local divider reset (LORST) circuitry 100 according to an embodiment of the disclosure.

The LORST circuitry 100 includes a clock switch circuit 101 and a plurality of (e.g., M) serially coupled D flip-flops (DFFs).

The clock switch circuit 101 receives a clock signal CLK and is controlled by a reset signal RST. The clock signal CLK can be either a global clock signal or a local clock signal. The reset signal RST can be either a global reset signal or a local reset signal. In the disclosure, the clock signal CLK and the reset signal RST can be also referred to as external clock signal and external reset signal, respectively. It is noted that the external reset signal RST does not have timing information of the external clock signal CLK. That is, the external reset signal RST may not be synchronous to the external clock signal CLK.

The clock switch circuit 101 includes a switch 102 and an inverter 103. An input terminal of the switch 102 is coupled to the external clock signal CLK and an output terminal of the switch 102 is coupled to a clock terminal of each DFF in the plurality of DFFs of the LORST circuitry 100. In addition, a control terminal of the switch 102 is coupled to an output terminal of the inverter 103. An input terminal of the inverter 103 is coupled to the external reset signal RST.

The operation of the clock switch circuit 101 is controlled by the external reset signal RST. When the external reset signal RST is enabled, the clock switch circuit 101 can block the external clock signal CLK so that no clock signal triggers the plurality of DFFs. When the external reset signal RST is disabled, the clock switch circuit 101 can pass the external clock signal CLK to be an internal clock signal CLK_INT that triggers the plurality of DFFs.

In FIG. 1, it is assumed that the external reset signal RST is enabled at logic 1 (e.g., a supply voltage VCC) and disabled at logic 0 (e.g., a ground voltage GND), and the switch 102 is turned on and off when the control terminal of the switch 102 is set as logic 1 and logic 0, respectively. Accordingly, when the external reset signal RST is enabled, the inverter 103 receives logic 1 and outputs logic 0, setting the control terminal of the switch 102 as logic 0. Therefore, the switch 102 is turned off, and then the external clock signal CLK is blocked by the switch 102. When the external reset signal RST is disabled, the inverter 103 receives logic 0 and outputs logic 1, setting the control terminal of the switch 102 as logic 1. Therefore, the switch 102 is turned on, and then the external clock signal CLK can be passed through the switch 102 to be the internal clock signal CLK_INT that is coupled to the clock terminal of each DFF.

It is noted, in other embodiments, the external reset signal RST can be enabled at logic 0 and disabled at logic 1. Accordingly, the switch 102 is turned on and off when the control terminal of the switch 102 is set as at logic 0 and at logic 1, respectively.

Referring back to FIG. 1, each DFF in the LORST circuitry 100 includes a data terminal D, an output terminal Q (and/or an inverse output terminal QB), a reset terminal R, and a clock terminal. The plurality of DFFs is serially coupled from a first DFF 104 to a last DFF 107. That is, a data terminal D of a current DFF (e.g. DFF 105) is coupled to an output terminal Q of a previous DFF (e.g., DFF 104), and an output terminal Q of the current DFF is coupled to a data terminal D of a next DFF (e.g., DFF 106).

According to aspects of the disclosure, the LORST circuitry 100 can output an internal reset signal RST_INT through the inverse output terminal QB of the last DFF 107.

In the FIG. 1 example, it is assumed that the internal reset signal RST_INT is enabled at logic 1 and disabled at logic 0, thus a data terminal D of the first DFF 104 is coupled to logic 1. However, it is noted that if the internal reset signal RST_INT is enabled at logic 0 and disabled at logic 1, the data terminal D of the first DFF 104 can be coupled to logic 0 (e.g., GND) in another example. In such an example, when the external reset signal RST is enabled, each DFF outputs logic 1 so that the internal reset signal RST_INT is set as logic 0 through the inverse output terminal QB of the last DFF 107. When the external reset signal RST is disabled, after M clock signal cycles, the internal reset signal RST_INT is disabled at logic 1 due to the data terminal D of the first DFF 104 being coupled to logic 0. Therefore, the data terminal D of the first DFF is coupled to a logic voltage at which the internal reset signal RST_INT is enabled.

In addition, in the LORST circuitry 100, a clock terminal and a reset terminal of each DFF are coupled to the output terminal of the switch 102 and the external reset signal RST, respectively. The inverse output terminal QB of the last DFF 107 is coupled to a plurality of (e.g., N) divider blocks DIV-1~DIV-N in the FIG. 1 example. However, in another example, the inverse output terminal QB of the last DFF 107 can be coupled to various circuit blocks with a reset function.

According to aspects of the disclosure, the internal reset signal RST_INT can be synchronous to the external clock signal CLK in order to reset the divider blocks DIV-1~DIV-N in the FIG. 1 example or various circuit blocks in other examples. An operation of resetting the divider blocks DIV-1~DIV-N (or various circuit blocks in other examples) includes: (1) resetting all internal nodes of the divider blocks with predefined voltages; (2) using the LORST circuity to generate internal reset signal RST_INT that is synchronous to the external clock signal CLK; and (3) unlocking the divider blocks, so that the divider blocks can be free running.

Specifically, when the external reset signal RST is enabled, the external clock signal CLK is blocked, and each DFF is set in a reset mode and thus outputs logic 0, so that the internal reset signal RST_INT is set as logic 1 through the inverse output terminal QB of the last DFF 107. When the external reset signal RST is disabled, each DFF is set in a standby mode and the external clock signal CLK is passed through the switch 102 to each DFF. After a number of clock signal cycles, the internal reset signal RST_INT is flipped from logic 1 to logic 0. Accordingly, the internal reset signal RST_INT can be synchronous to the external clock signal CLK. The number of clock signal cycles is dependent on a total number of the DFFs. In FIG. 1, the total number of the DFFs is M.

FIGS. 2A-2D show detailed operations of the LORST circuitry 100 according to an embodiment of the disclosure. It is assumed that all DIV-1~DIV-N blocks are set in the reset mode and in the standby mode when the internal reset signal is enabled at logic 1 and disabled at logic 0, respectively.

In a first step, as shown in FIG. 2A, the external reset signal RST is enabled at logic 1 and the inverter 103 outputs logic 0, so that the switch 102 is turned off and the external clock signal CLK is blocked by the switch 102. The internal clock signal CLK_INT is set as logic 0 and each DFF is set in the reset mode and outputs logic 0. Accordingly, the internal reset signal RST_INT is enabled and set as logic 1 through the inverse output terminal QB of the last DFF 107.

In a second step, as shown in FIG. 2B, the external reset signal RST transits from logic 1 to logic 0 after a certain number of clock signal cycles after the first step. That is, the external reset signal RST transits from the enable status to the disable status, and thus each DFF transits from the reset mode to the standby mode. However, due to the propagation delay, the inverter 103 still outputs logic 0 and thus the external clock signal CLK is still blocked by the switch 102 so that the internal clock signal CLK_INT is still set as logic 0.

In a third step, as shown in FIG. 2C, the LORST circuitry 100 has completed the transition from the reset mode to the standby mode. Accordingly, the external reset signal RST is disabled at logic 0 and the inverter 103 outputs logic 1, so that the switch 102 is turned on and the clock signal CLK is passed through the switch 102 to initiate the internal clock signal CLK_INT. After a first clock signal cycle of the internal clock signal CLK_INT, the first DFF 104 is flipped from logic 0 to logic 1 since the data terminal D of the first DFF 104 is coupled to logic 1 (e.g., VCC). However, the outputs of other DFFs including the last DFF 107 are not flipped and still set as logic 0. Accordingly, the internal reset signal RST_INT is still enabled and set as logic 1 through the inverse output terminal QB of the last DFF 107.

In a fourth step, as shown in FIG. 2D, the LORST circuitry 100 has completed M clock signal cycles after the transition from the reset mode to the standby mode. That is, the LORST circuit completes first M clock signal cycles of the internal clock signal CLK_INT. Accordingly, all outputs of the plurality of DFFs including the last DFF 107 are flipped and set as logic 1, the internal reset signal RST_INT is disabled and flipped from logic 1 to logic 0 through the inverse output terminal QB of the last DFF 107.

Through this operation, the internal reset signal RST_INT can be synchronous to the external clock signal CLK to reset the divider blocks (or various circuit blocks in other examples) that are coupled to the internal reset signal RST_INT.

Figure 3:
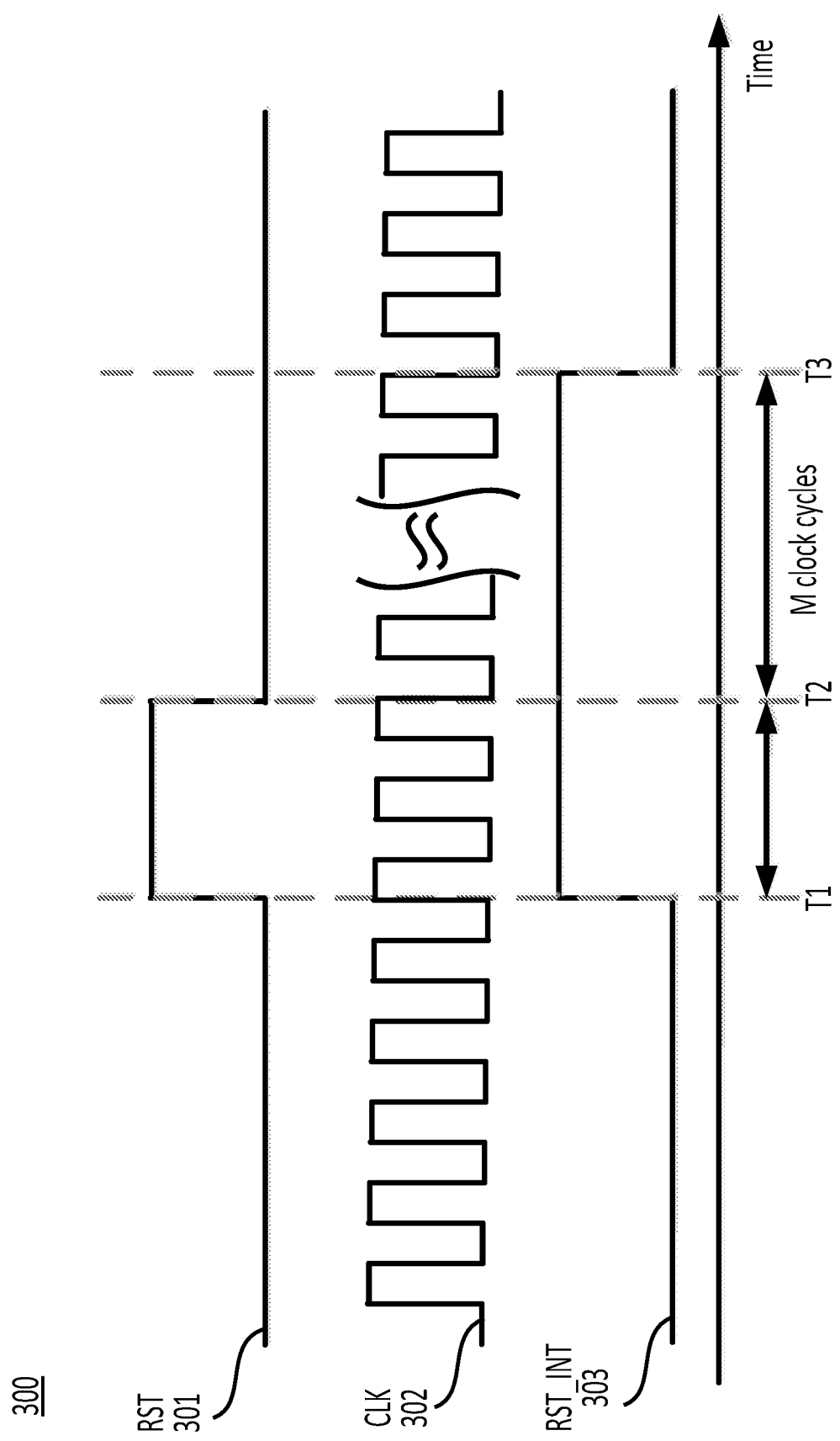
FIG. 3 shows an exemplary timing diagram of controlling an internal reset signal RST_INT according to an embodiment of the disclosure.

FIG. 3 shows an exemplary timing diagram 300 of controlling the internal reset signal RST_INT according to an embodiment of the disclosure. For simplicity, the external reset signal RST is set to be synchronous to the clock signal CLK. However, it is noted that the external reset signal RST may not be synchronous to the clock signal CLK and can be randomly enabled and disabled.

In the timing diagram 300, a waveform 301 depicts the external reset signal RST, a waveform 302 depicts the external clock signal CLK, and a waveform 303 depicts the internal reset signal RST_INT. At T1, the external reset signal RST is enabled at logic 1, and thus the LORST circuitry 100 is set in the reset mode, enabling the internal reset signal RST_INT. At T2, the external reset signal RST is disabled at logic 0 and thus the LORST circuitry 100 is set in the standby mode, but the internal reset signal RST_INT is still enabled at logic 1 since the inverse output terminal QB of the last DFF 107 is not flipped. At T3, the internal reset signal RST_INT is disabled at logic 0 since the inverse output terminal QB of the last DFF 107 is flipped after a number of clock signal cycles. The number of clock signal cycles between T2 and T3 is dependent on a total number of the plurality of DFFs.

Figure 4:
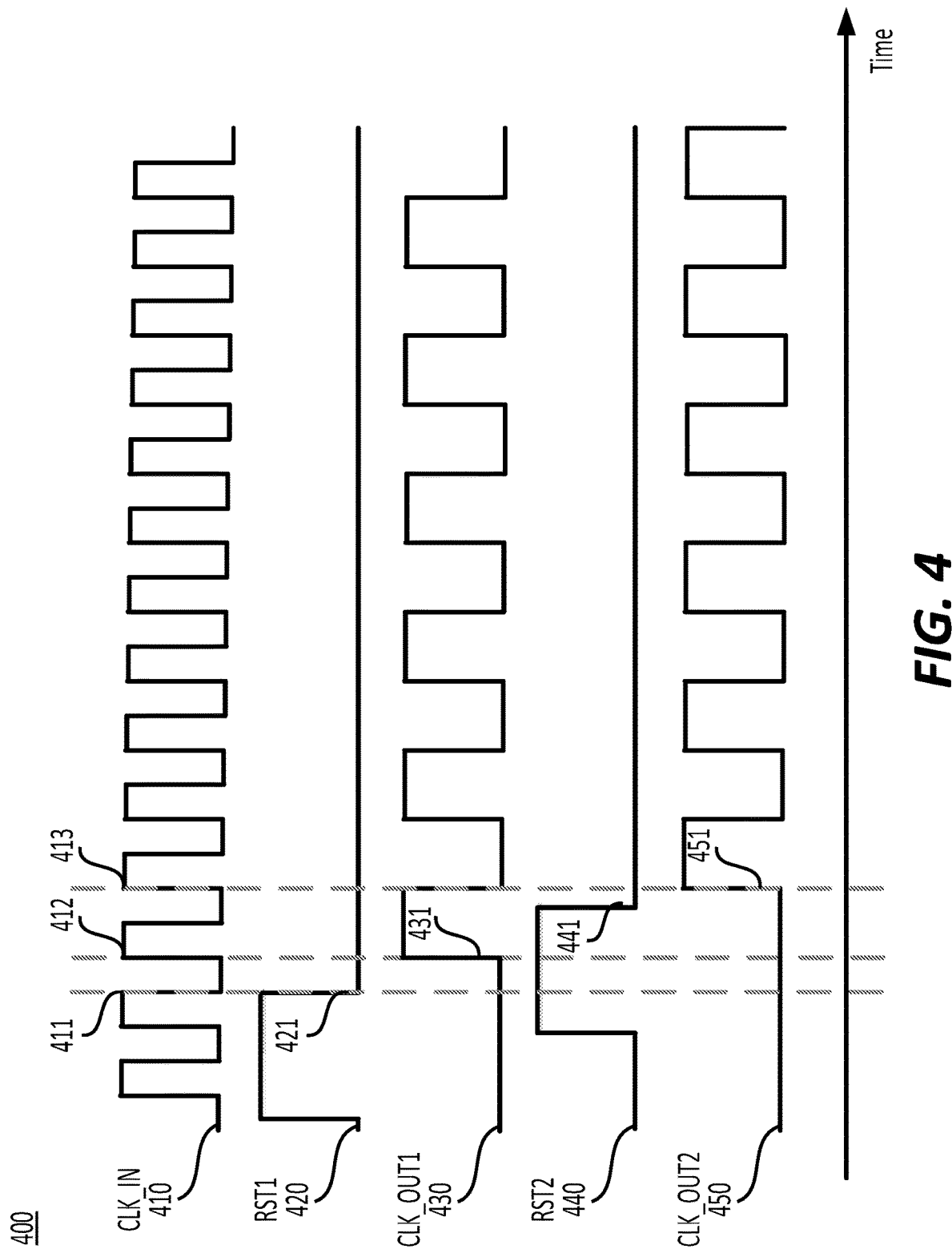
FIG. 4 shows an exemplary timing diagram according to an embodiment of the disclosure.

FIG. 4 shows an exemplary timing diagram 400 according to an embodiment of the disclosure. In the timing diagram 400, a waveform 410 depicts a clock signal CLK_IN with a frequency of freq input to a divide-by-2 (DIV2) divider circuitry, which can output a divided clock signal with a frequency of freq/2. The DIV2 divider is a rising edge triggered circuitry.

It is noted that the DIV2 divider is used in the FIG. 4 example just for simplicity, in another example, other types of divider, such as divide-by-3 (DIV3) or divide-by-4 (DIV4), can be used.

In the timing diagram 400, a waveform 420 depicts a reset signal RST1 for resetting the DIV2 circuit block. When the reset signal RST1 is enabled at logic 1, the DIV2 circuit block is set in the reset mode and suspends the output of the divided clock signal. When the reset signal RST1 is disabled at logic 0, the DIV2 circuit block is set in the standby mode and resumes the output of the divided clock signal. The dived clock signal is referred to as CLK_OUT1 and depicted in a waveform 430. It is noted that the reset signal RST1 is synchronous to the input clock signal CLK_IN, and thus a falling edge 421 at which the reset signal RST1 is disabled is synchronous to a falling edge 411 of the input clock signal CLK_IN. After the reset signal RST1 is disabled at the falling edge 421, the divided clock signal CLK_OUT1 starts free running at a next rising edge, i.e., rising edge 412, of the input clock signal CLK_IN. Accordingly, a rising edge 431 of a first clock of the divided clock signal CLK_OUT1 is synchronous to the rising edge 412 of the input clock signal CLK_IN.

Still referencing to the timing diagram 400, a waveform 440 depicts a reset signal RST2 for resetting the same DIV2 circuit block. When the reset signal RST2 is enabled at logic 1, the DIV2 circuit block is set in the reset mode and suspends the output of the divided clock signal; when the reset signal RST2 is disabled at logic 0, the DIV2 circuit block is set in the standby mode and resumes the output of the divided clock signal. The divided clock signal is referred to as CLK_OUT2 and depicted in a waveform 450. It is noted that the reset signal RST2 is not synchronous to the input clock signal CLK_IN, and thus a falling edge 441 at which the reset signal RST2 is disabled is not synchronous to any rising or falling edge of the input clock signal CLK_IN. After the reset signal RST2 is disabled at the falling edge 441, the divided clock signal CLK_OUT2 starts free running at a next rising edge, i.e., rising edge 413, of the input clock signal CLK_IN. Accordingly, a rising edge 451 of a first clock of the divided clock signal CLK_OUT2 is synchronous to the rising edge 413 of the clock signal CLK_IN.

It is noted that, in the timing diagram 400, the divided clock signals CLK_OUT1 and CLK_OUT2 have complementary phases. It indicates that, a phase of a divided clock signal (e.g., CLK_OUT2) that is controlled by a randomly reset signal (e.g., RST2) can be different from or even complementary to a phase of a divided clock signal (e.g., CLK_OUT1) that is controlled by a synchronously reset signal (e.g., RST1). Therefore, for multiple divided clock signals, it is desirable to use synchronously reset signal, so that each divided clock signal can have a pre-determined phase.

Figure 5:
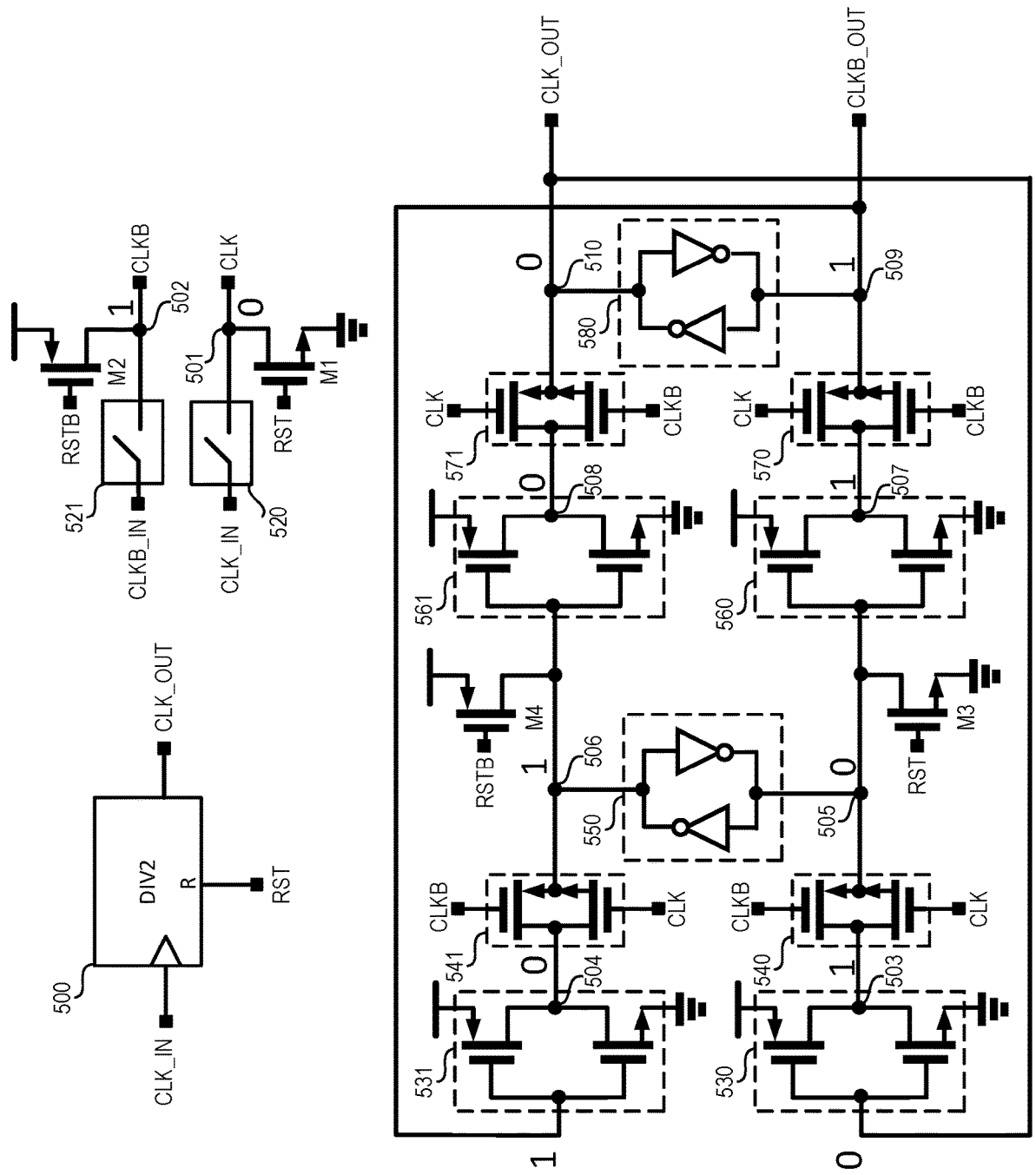
FIG. 5 shows an exemplary divider circuit block and the corresponding detailed circuitry according to an embodiment of the disclosure.

FIG. 5 shows an exemplary divider circuit block 500 and the corresponding detailed circuitry according to an embodiment of the disclosure. The divider circuit block 500 is a DIV2 block that receives through an input terminal CLK_IN an input clock signal with a frequency of freq (e.g., the input clock signal CLK_IN 410 in the FIG. 4 example) and outputs through an output terminal CLK_OUT a divided clock signal with a frequency of freq/2 (e.g., the divided clock signal CLK_OUT1 430 in the FIG. 4 example). A reset terminal RST is used for receiving a reset signal (e.g., the reset signal RST1 420 in the FIG. 4 example) that is enabled and disabled to set the divider circuit block 500 in the reset mode and in the standby mode, respectively. That is, when the reset signal (e.g., RST1 420) is enabled (e.g., at logic 1), the divided clock signal (e.g., CLK_OUT1 430) is turned off and each internal nodes of the divider circuit block 500 is set with a respective predefined charge. When the reset signal (e.g., RST1 420) is disabled (e.g., at logic 0), the divided clock signal (e.g., CLK_OUT1 430) is turned on and an initial phase of the divided clock signal is defined by the preset charges of the internal nodes of the divider circuit block 500.

Specifically, when the reset signal is enabled at logic 1 (i.e., the inverse reset signal is disabled at logic 0), transistors M1-M4 are turned on. Thus, the logic voltages at nodes 501 and 505 are logic 0, and the logic voltages at nodes 502 and 506 are logic 1, respectively. The internal terminals CLK and CLKB are logic 0 and logic 1, respectively. Since the logic voltages at nodes 505 and 506 are logic 0 and logic 1, the logic voltages at nodes 507 and 508 are logic 1 and logic 0, respectively, due to the inverters 560 and 561. Since the logic voltages at nodes 501 and 502 are logic 0 and logic 1, transmission gates 540 and 541 are turned off, and transmission gates 570 and 571 are turned on, causing the logic voltages at nodes 509 and 510 being logic 1 and logic 0, respectively. Therefore, the logic voltages at the output terminal CLK_OUT and the inverse output terminal CLK-B_OUT of the divider circuit block 500 is logic 0 and logic 1, respectively. Due to the inverters 530 and 531, the logic voltages at nodes 503 and 504 are logic 1 and logic 0, respectively.

It is shown that when the reset signal of the divider circuit block 500 is enabled, the output terminal CLK_OUT is clapped to be logic 0. When the reset signal is disabled, the divided clock signal can be output from the output terminal CLK_OUT. Therefore, a first clock signal cycle of the divided clock signal is always from logic 0 to logic 1, indicating a predefined phase for the divided clock signal.

Figure 6:
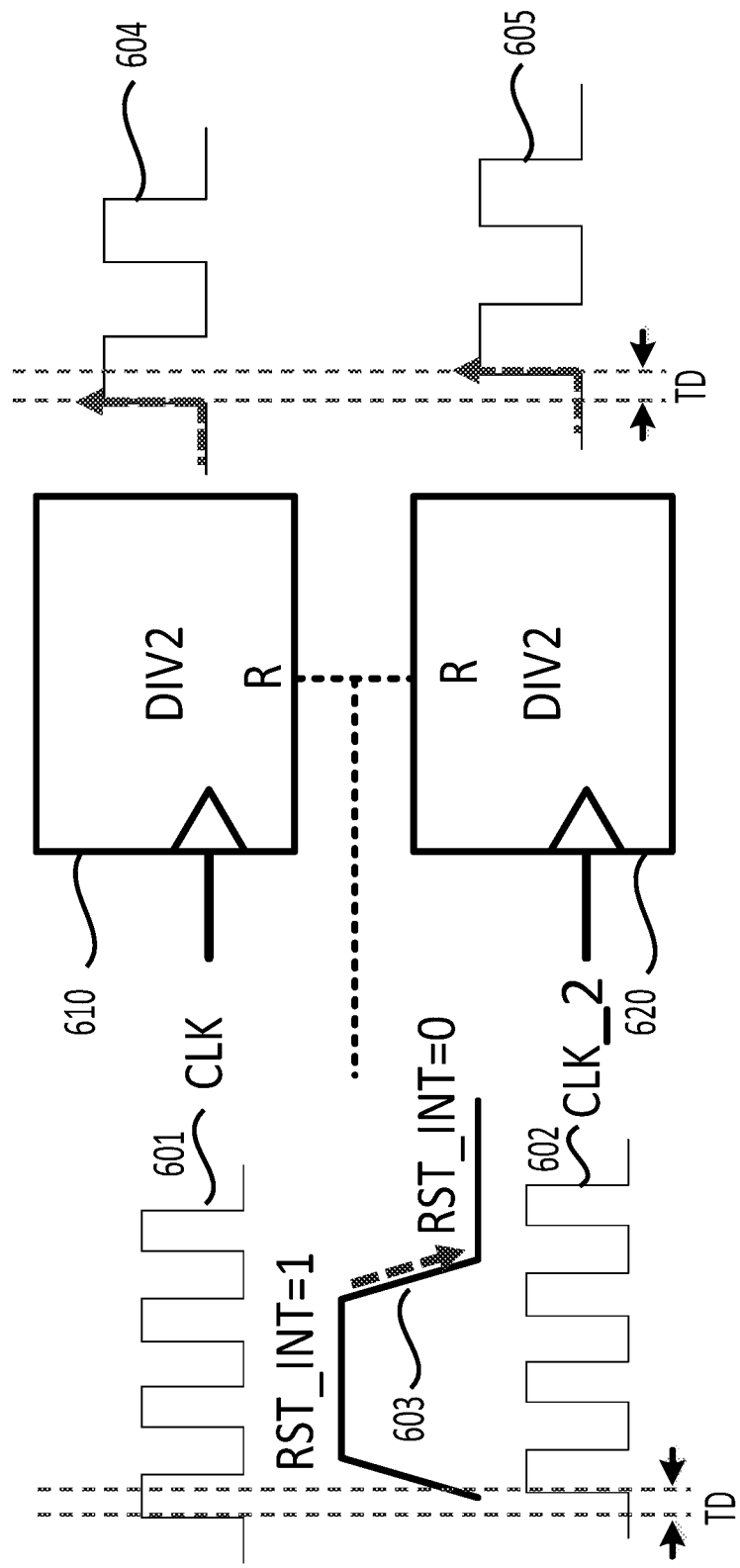
FIG. 6 shows an example of controlling two divider circuit blocks according to an embodiment of the disclosure.

FIG. 6 shows an example of controlling two divider circuit blocks according to an embodiment of the disclosure. In FIG. 6, the two divide-by-2 (DIV2) circuit blocks, i.e., a first DIV2 block 610 receives a first input clock signal CLK 601 and outputs a first divided clock signal 604, and a second DIV2 block 620 receives a second input clock signal CLK_60 602 and outputs a second divided clock signal 605. It is noted that both the first input clock signal CLK 601 and the second input clock signal CLK_60 602 have the same frequency. However, in some embodiments, the phases of these two input clock signals may be different. For example, a phase difference between the first input clock signal CLK 601 and the second input clock signal CLK_60 602 is 60°.

In FIG. 6, the reset terminals of the first DIV2 block 610 and the second DIV2 block 620 are coupled to an internal reset signal RST_INT 603 that is synchronous to the first clock signal CLK 601. When the internal reset signal RST_INT 603 is enabled at logic 1, both the first DIV2 block 610 and the second DIV2 block 620 are set in the reset mode, in which all internal nodes of the first DIV2 block 610 and the second DIV2 block 620 are set with predefined voltages. When the internal reset signal RST_INT 603 is disabled at logic 0, both the first DIV2 block 610 and the second DIV2 block 620 are set in the standby mode, and the first clock cycles of both the first divided clock signal 604 and the second divided clock signal 605 are from logic 0 to logic 1. In addition, the phase difference between the first divided clock signal 604 and the second divided clock signal 605 is the same as the phase difference between the first input clock signal CLK 601 and the second input clock signal CLK_60 602.

FIG. 7A shows an exemplary local LORST configuration according to an embodiment of the disclosure. In FIG. 7A, two DIV2 blocks 701 and 702 are placed close to each other, thus a single LORST block 703 is used to control both DIV2 blocks 701 and 702 by generating the internal reset signal RST_INT. However, if the two DIV2 blocks 701 and 702 are placed far from each other, using a single LORST to control both DIV2 blocks 701 and 702 may cause a meta-stability issue.

FIG. 7B shows an exemplary cascade LORST configuration according to an embodiment of the disclosure. In FIG. 7B, two DIV2 blocks 711 and 712 are separated far from each other so that each block is associated with a respective local LORST block. For example, the DIV2 block 711 is associated with a local LORST block 713, and the DIV2 block 712 is associated with a local LORST block 714. Each DIV2 block receives an internal clock signal and outputs a divided clock signal. For example, the DIV2 block 711 receives an internal clock signal CLK_IN1 and outputs a divided clock signal CLK_D1, and the DIV2 block 712 receives an internal clock signal CLK_IN2 and outputs a divided clock signal CLK_D2. Both internal clock signals CLK_IN1 and CLK_IN2 are derived from an external clock signal CLK. However, in some related cases, at least one of the internal clock signals may not be synchronous to the external clock CLK, leading to the meta-stability issue.

To avoid the meta-stability issue, a buffer circuit block 718 is inserted between the external clock signal CLK and the DIV2 blocks 711 and 712. The buffer circuit block 718 includes a buffer 716, a switch 717, and a local LORST block 715. The LORST block 715 can output a switch control signal CLK_SW used for controlling the switch 717. In an embodiment, the switch 717 is turned off when the switch control signal CLK_SW is set as logic 1 and on when the switch control signal CLK_SW is set as logic 0. Accordingly, the switch control signal CLK_SW is synchronized with the external clock signal CLK through the LORST 715.

When the switch 717 is turned on, the internal clock signals CLK_IN1 and CLK_IN2 can be synchronous to the external clock signal CLK. Accordingly, initial waveforms (or phases) of both internal clock signals are same, e.g., the first clock cycles of both internal clock signals are always from logic 0 to logic 1. In addition, each internal clock signal is input to a respective DIV2 block and a local LORST associated with the DIV2 block. For example, the internal clock signal CLK_IN1 is input to the DIV2 block 711 and the LORST block 713, and the internal clock signal CLK_IN2 is input to the DIV2 block 712 and the LORST block 714. Therefore, for different LORST blocks, the internal clock signals have the same predefined initial waveforms (or phases). The meta-stability issue among different transmitter paths can be avoided.

It is noted that the reset terminals of all local LORST blocks 713-715 are coupled to a same external reset signal RST.

FIGS. 8A-8D show detailed operations of the cascade LORST configuration according to an embodiment of the disclosure. It is noted that each LORST block in the cascade LORST configuration includes M DFFs.

In a first step, as shown in FIG. 8A, the external reset signal RST is enabled at logic 1, so that all local LORST blocks are set in the reset mode and output logic 1. That is, the internal reset signal RST_INT1 output from the LORST block 713 is set as logic 1, the internal reset signal RST_INT2 output from the LORST block 714 is set as logic 1, and the switch control signal CLK_SW output from the LORST block 715 is set as logic 1. Therefore, both the DIV2 blocks 711 and 712 are set in the reset mode; the switch 717 is turned off; both the internal clock signals CLK_IN1 and CLK_IN2 are set as logic 0; and both the divided clock signals CLK_D1 and CLK_D2 are set as logic 0.

In a second step, as shown in FIG. 8B, the external reset signal RST transits from logic 1 to logic 0 after a certain number of clock cycles after the first step. That is, the external reset signal RST transits from the enable status to the disable status. Then all the LORST blocks 713-715 are set in the standby mode and the LORST block 715 starts free running, but the LORST blocks 713 and 714 do not start free running since the internal clock signals CLK_IN1 and CLK_IN2 are still set as logic 0. Due to the propagation delay, the outputs of the local LORST blocks are still set as logic 1. Therefore, the internal reset signals RST_INT1 and RST_INT2 and the switch control signal CLK_SW are still set as logic 1; both the DIV2 blocks 711 and 712 are set in the reset mode; the switch 717 is still turned off; and the internal clock signals CLK_IN1 and CLK_IN2 and the divided clock signals CLK_D1 and CLK_D2 are still set as logic 0.

Figure 8C:
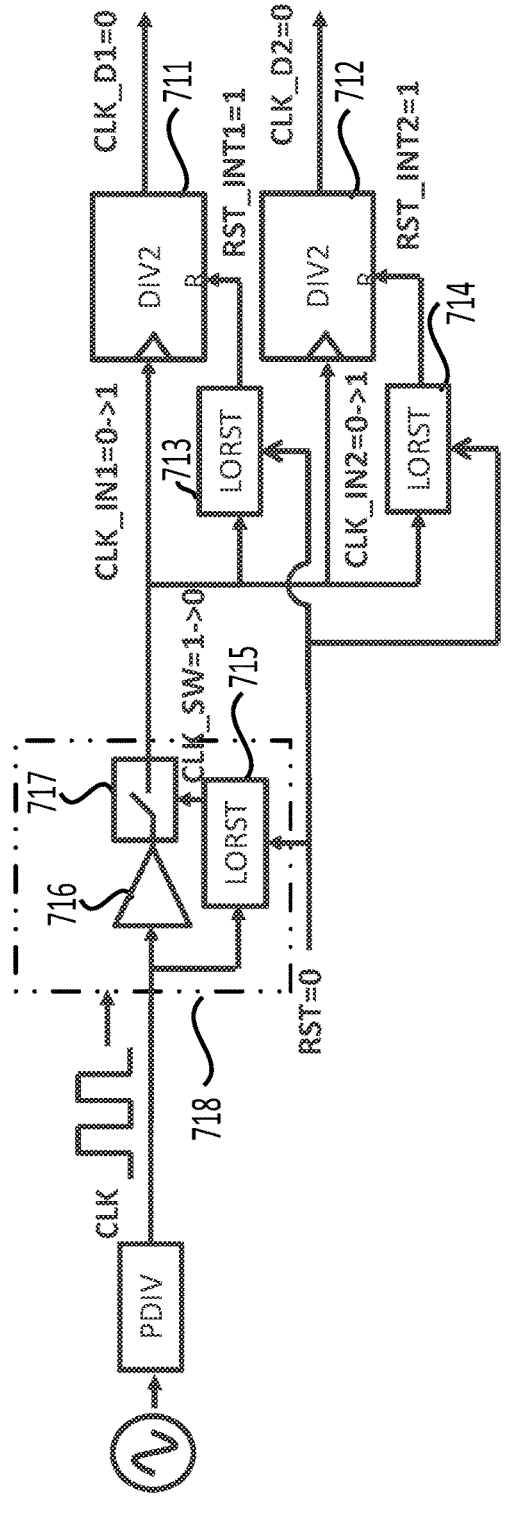

In a third step, as shown in FIG. 8C, the external reset signal RST is still disabled and set as logic 0 after M clock cycles after the second step, i.e., the transition of the external reset signal RST from the enable status to the disable status. Since the LORST block 715 includes M DFFs, the switch control signal CLK_SW output from the LORST block 715 flips from logic 1 to logic 0. Then the switch 717 is turned off, and the external clock signal CLK can be passed through the switch 717 to initiate the internal clock signals CLK_IN1 and CLK_IN2. Accordingly, both the internal clock signals CLK_IN1 and CLK_IN2 start to rise from logic 0 to logic 1. However, both the internal reset signals RST_INT1 and RST_INT2 are still set as logic 1. Therefore, both the DIV2 blocks 711 and 712 are set in the reset mode; both the divided clock signals CLK_D1 and CLK_D2 are still set as logic 0.

Figure 8D:
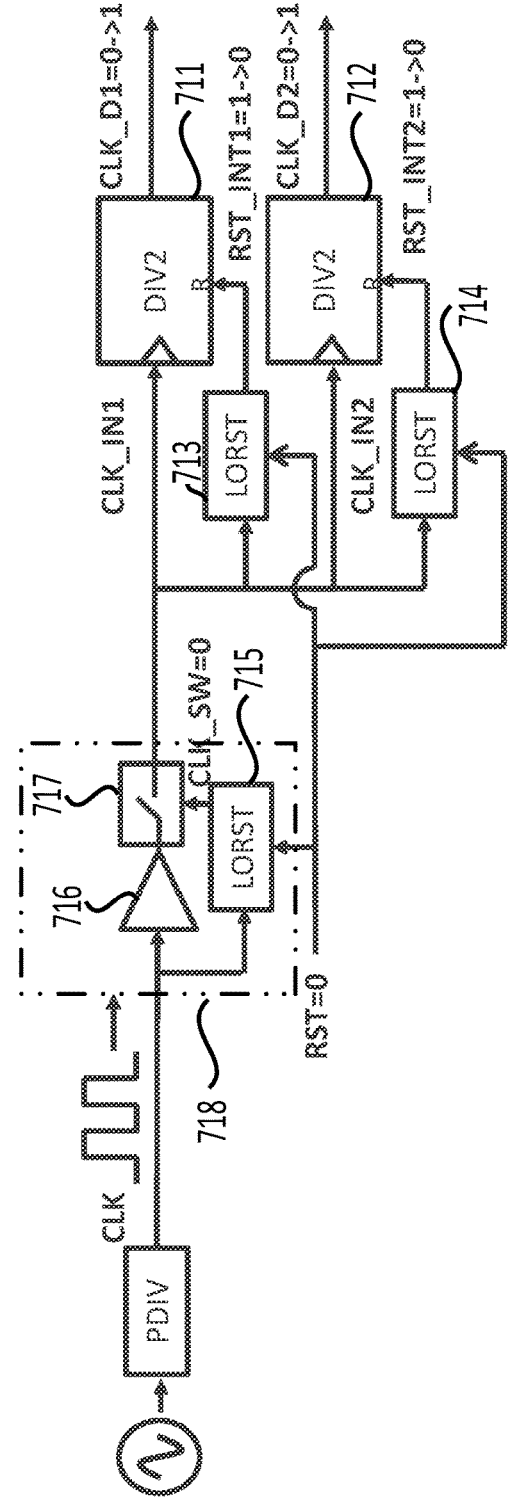

In a fourth step, as shown in FIG. 8D, the external reset signal RST is still disabled and set as logic 0 after M clock cycles after the third step, i.e., 2 M clock signal cycles after transiting from the enable status to the disable status. That is, both the internal clock signals CLK_IN1 and CLK_IN2 have been operated with M clock cycles. Since each of the LORST blocks 713 and 714 includes M DFFs, the corresponding internal reset signal RST_INT1/RST_INT2 is disabled and flipped from logic 1 to logic 0, and then the divided clock signal CLK_D1/CLK_D2 starts to rise from logic 0 to logic 1.

Through this operation, initial waveforms (or phases) for different LORST blocks can be same even these LORST blocks are separated far from each other.

Figure 8E:
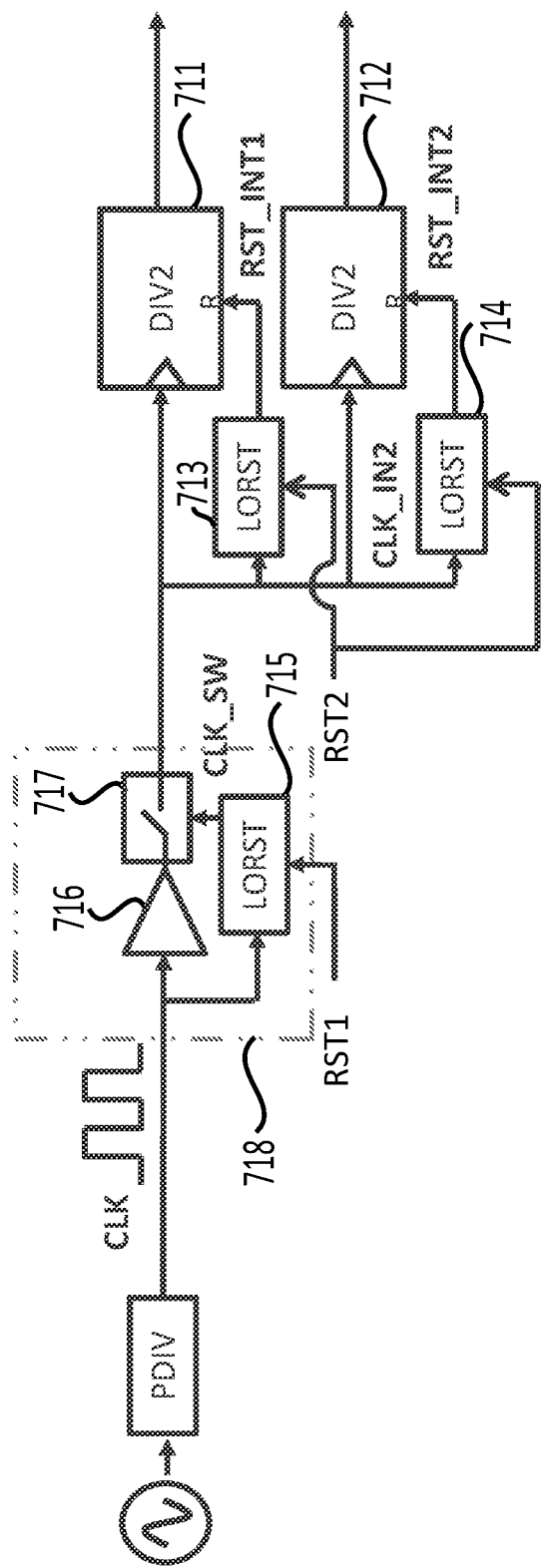
FIG. 8E show an alternative of the cascade LORST configuration according to an embodiment of the disclosure.

FIG. 8E shows an alternative of the cascade LORST configuration according to an embodiment of the disclosure. In FIG. 8E, the LORST 715 in the buffer circuit block 718 and the local LORST blocks (e.g., LORST blocks 713 and 714) are controlled by different external reset signals. For example, RST1 controls the LORST block 715 and RST2 controls the LORST blocks 713 and 714. The control timing of RST1 and RST2 can be different. That is, RST1 can be later than or earlier than RST2. RST1 can be a delayed version of RST2 or RST2 can be a delayed version of RST1. It is noted that the timing relationship between RST1 and RST2 is not limited in this disclosure.

Figure 9:
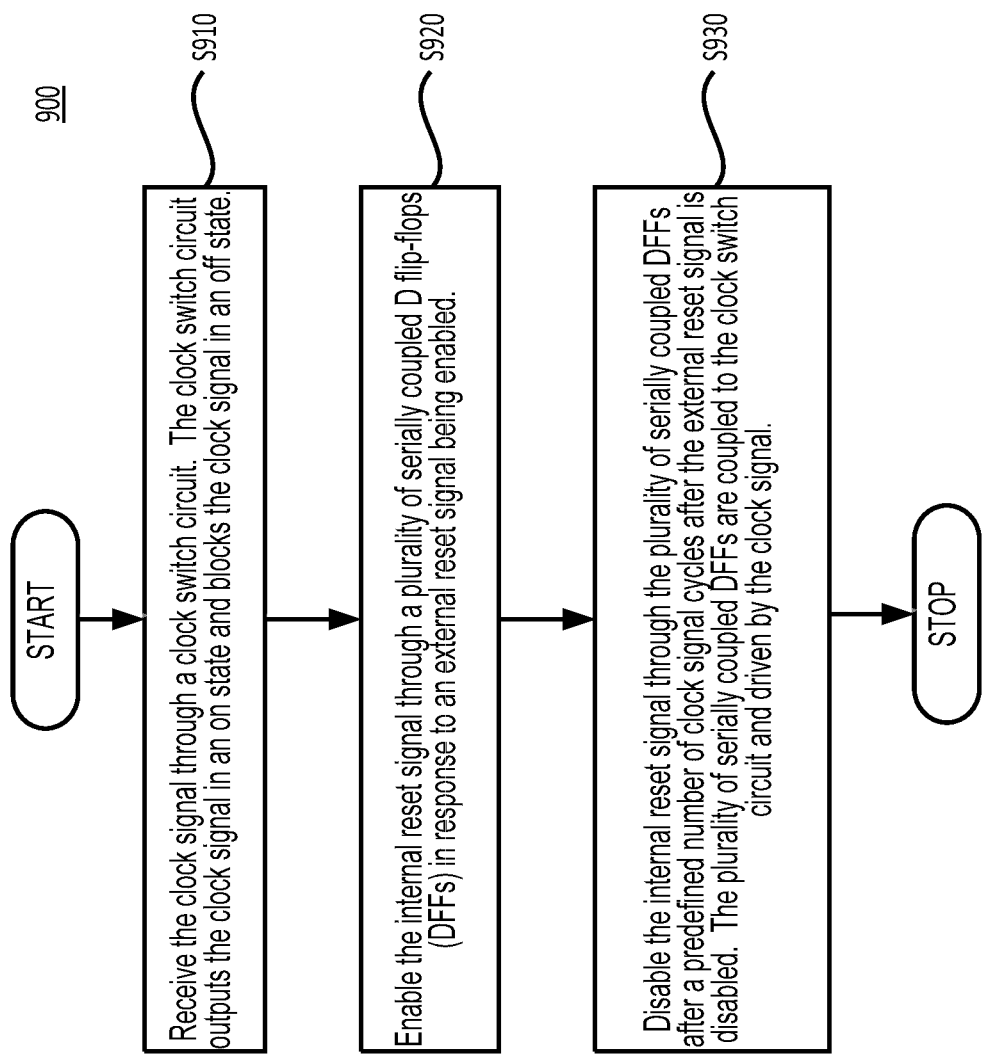
FIG. 9 shows a flowchart of an exemplary process according to an embodiment of the disclosure.

FIG. 9 shows a flowchart of an exemplary process 900 according to an embodiment of the disclosure. The process 900 is used for controlling an internal reset signal that is synchronous to a clock signal. The process 900 may start from step S910, where the process 900 receives the clock signal through a clock switch circuit. The clock switch circuit outputs the clock signal in an on state and blocks the clock signal in an off state. Then the process 900 proceeds to step S920.

At step S920, the process 900 enables the internal reset signal through a plurality of serially coupled D flip-flops (DFFs) in response to an external reset signal being enabled. Then the process 900 proceeds to step S930.

At step S930, the process 900 disables the internal reset signal through the plurality of serially coupled DFFs after a predefined number of clock signal cycles after the external reset signal is disabled. The plurality of serially coupled DFFs are coupled to the clock switch circuit and driven by the clock signal. Then the process 900 terminates.

In an embodiment, a data terminal of a first DFF in the plurality of DFFs is coupled to a logic voltage at which the internal reset signal is enabled, and an inverse output terminal of a last DFF in the plurality of DFFs is coupled to the internal reset signal.

In an embodiment, an input terminal of the clock switch circuit is coupled to the clock signal, an output terminal of the clock switch circuit is coupled to a clock terminal of each DFF in the plurality of DFFs, and a control terminal of the clock switch is coupled to the external reset signal.

In an embodiment, the clock switch circuit is in the off state so that the clock signal is not output to the plurality of DFFs in response to the external reset signal being enabled, and in the on state so that the clock signal is output to the plurality of DFFs in response to the external reset signal being disabled.

In an embodiment, the external reset signal is coupled to a reset terminal of each DFF in the plurality of DFFs.

In an embodiment, each DFF is set in a reset mode and in a standby mode in response to the external reset signal being enabled and disabled, respectively.

In an embodiment, the predefined number of clock signal cycles is dependent on a total number of DFFs.

In general, the processes 900 can be suitably adapted by modifying one or more operations in the respective process, adding one or more operations, omitting one or more operations, and the like. For example, an additional operation can be added where a selection of one or more specific processes is made in a process set including the processes 900.

Figure 10A:
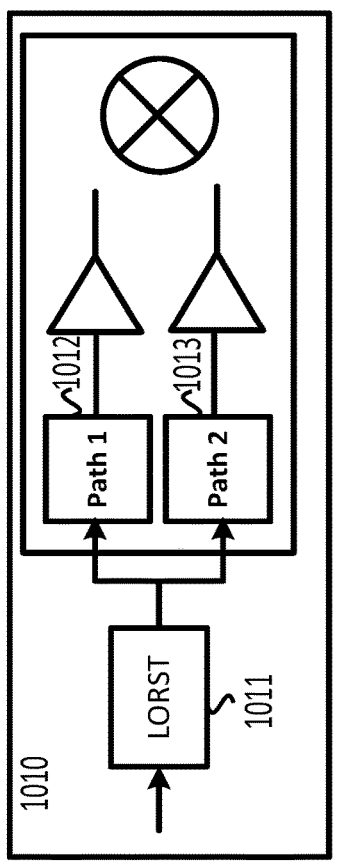
FIGS. 10A-10C show some exemplary transceivers according to embodiments of the disclosure.
Figure 10B:
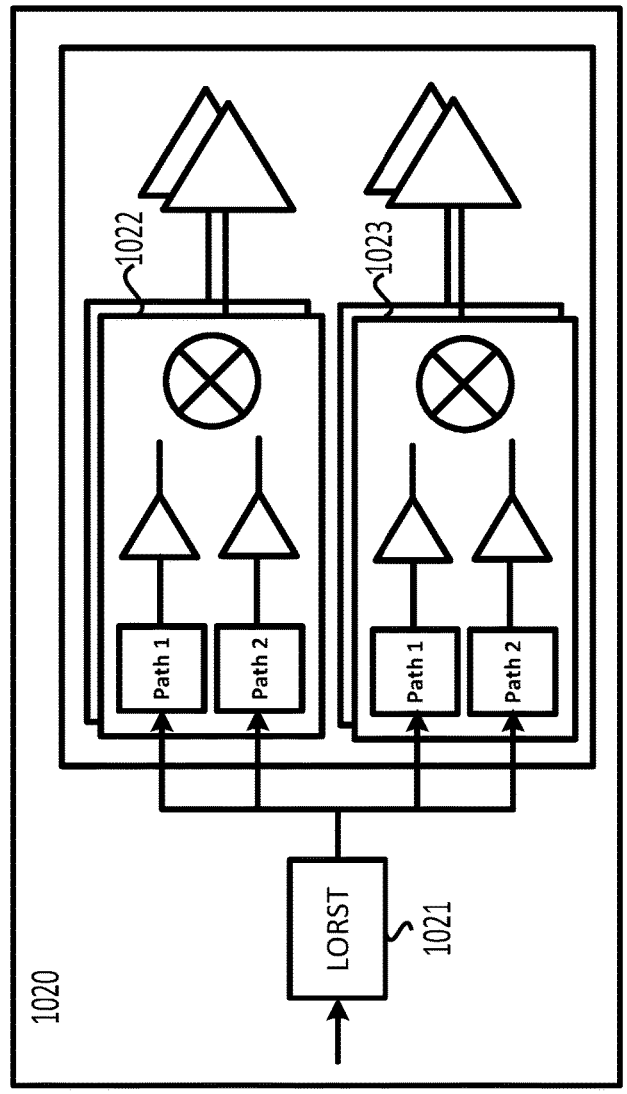
Figure 10C:
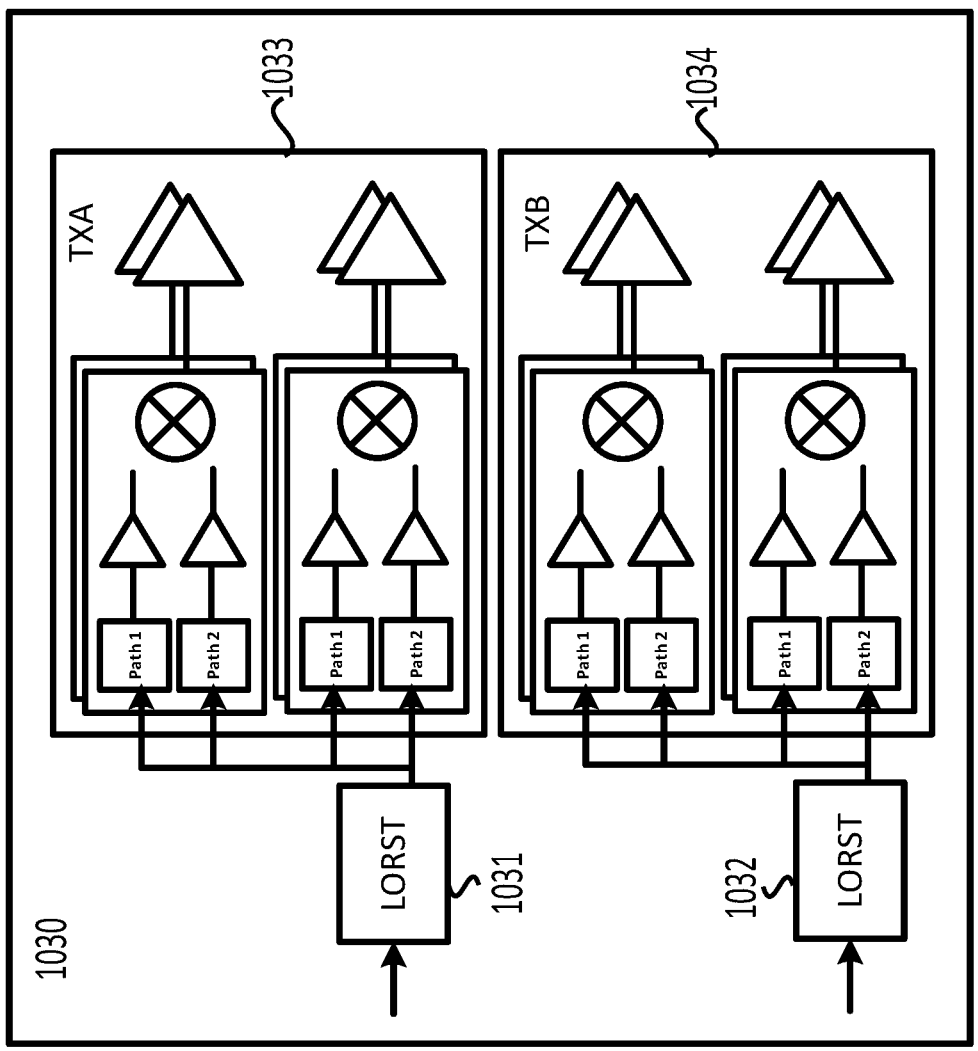

FIGS. 10A-10C show some exemplary transceivers according to embodiments of the disclosure. As shown in FIG. 10A, a first transceiver 1010 configuring with a phase rotation (PR) architecture employs an LORST block 1011 to synchronize phases of two path dividers 1012 and 1013. As shown in FIG. 10B, a second transceiver 1020 configuring with a low power mode (LPM) architecture for gain slicing employs an LORST block 1021 to synchronize phases of different divider slices, for example, the divider slice 1022 and the divider slice 1023. As shown in FIG. 10C, a third transceiver 1030 configuring with multiple transmitters (TX) for multi-input multi-output (MIMO) employs multiple LORST block (e.g., LORST blocks 1031 and 1032) to synchronize phases of different TXs (e.g., TXA 1033 and TXB 1034).

It is noted that both the LORST blocks 1011 and 1021 can be with the local LORST configuration, while the LORST blocks 1031 and 1032 can be with the cascade LORST configuration.

According to aspects of the disclosure, at least some of the various processes, operations, and techniques described above may be implemented utilizing hardware, a processor executing firmware instructions, a processor executing software instructions, or any combination thereof. Also, some of the various processes, operations, and techniques may be performed in a different order (and/or concurrently) and still achieve desirable results. When implemented utilizing a processor executing software or firmware instructions, the software or firmware instructions may be stored in any computer readable memory such as on a magnetic disk, and optical disk, or other storage medium, in a random access memory (RAM) or read-only memory (ROM) or flash memory, processor, hard disk drive, optical disk drive, tape drive, etc. Likewise, the software or firmware instructions may be delivered to a user or a system via any known or desired delivery method including, for example, on a computer readable disk or other transportable computer storage mechanism or via communication media. Communication media typically embodies computer readable instructions, data structures, program modules or other data in a modulated data signal such as a carrier wave or other transport mechanism. The term "modulated data signal" means signal that has one or more of its characteristics set or changed in such a manner as to encode information in the signal. By way of example, and not limitation, communication media includes wire media such as a wired network or direct-wired connection, and wireless media such as acoustic, radio frequency, infrared and other wireless media. Thus, the software or firmware instructions may be delivered to a user or a system via communication channels such as telephone line, a DSL line, cable television line, a fiber optics line, wireless communication channels, the Internet, etc. (which are viewed as being the same as or interchangeable with providing such software via a transportable storage medium). The software or firmware instructions may include machine readable instructions that, when executed by the processor, cause the processor perform various acts.

When implemented in hardware, the hardware may comprise one or more of discrete components, an integrated circuit, an application-specific integrated circuit (ASIC), etc.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An apparatus for controlling an internal reset signal that is synchronous to a clock signal, the apparatus comprising:
   a clock switch circuit that receives the clock signal and is configured to output the clock signal in an on state and block the clock signal in an of state; and
   a plurality of serially coupled D flip-flops (DFFs) that are coupled to the clock switch circuit and driven by the clock signal output from the clock switch circuit, the plurality of serially coupled DFFs being configured to enable the internal reset signal in response to an external reset signal being enabled and to disable the internal reset signal after a predefined number of clock signal cycles after the external reset signal is disabled, wherein
      each of the plurality of serially coupled DFFs includes a data input terminal, a data output terminal, a clock input terminal, and a reset terminal, and the data output terminal of one of two adjacent coupled DFFs is coupled to the data input terminal of the other one of the two adjacent coupled DFFs.

2. The apparatus of claim 1, wherein:
   the data input terminal of a first DFF in the plurality of DFFs is coupled to a logic voltage at which the internal reset signal is enabled; and
   an inverse data output terminal of a last DFF in the plurality of DFFs is coupled to the internal reset signal.

3. The apparatus of claim 1, wherein:
   an input terminal of the clock switch circuit is coupled to the clock signal;
   an output terminal of the clock switch circuit is coupled to the clock input terminal of each DFF in the plurality of DFFs; and
   a control terminal of the clock switch circuit is coupled to the external reset signal.

4. The apparatus of claim 3, wherein the clock switch circuit is in the off state so that the clock signal is not output to the plurality of DFFs in response to the external reset signal being enabled, and in the on state so that the clock signal is output the plurality of DFFs in response to the external reset signal being disabled.

5. The apparatus of claim 1, wherein the external reset signal is coupled to the reset terminal of each DFF in the plurality of DFFs.

6. The apparatus of claim 5, wherein each MT is set in a reset mode and in a standby mode in response to the external reset signal being enabled and disabled, respectively.

7. The apparatus of claim 1, Therein the predefined number of clock signal cycles is dependent on a total number of DFFs.

8. A method for controlling an internal reset signal that is synchronous to a clock signal, the method comprising:
   receiving the clock signal through a clock switch circuit;
   enabling the internal reset signal through a plurality of serially coupled D flip-flops (DFFs) in response to an external reset signal being enabled; and
   disabling the internal reset signal through the plurality of serially coupled DFFs after a predefined number of clock signal cycles after the external reset signal is disabled, wherein
      the clock switch circuit outputs the clock signal in an on state and blocks the clock signal in an off state, and
      the plurality of serially coupled DFFs are coupled to the clock switch circuit and driven by the clock signal output from the clock switch circuit, wherein
      each of the plurality of serially coupled DFFs includes a data input terminal, a data output terminal, a clock input terminal, and a reset terminal, and the data output terminal of one of two adjacent coupled DFFs is coupled to the data input terminal of the other one of the two adjacent coupled DEB.

9. The method of claim 8, wherein:
   the data input terminal of a first DFF in the plurality of DFFs is coupled to a logic voltage at which the internal reset signal is enabled; and
   an inverse data output terminal of a last DFF in the plurality of DFFs is coupled to the internal reset signal.

10. The method of claim 8, wherein:
    an input terminal of the clock switch circuit is coupled to the clock signal;
    an output terminal of the clock switch circuit is coupled to the clock input terminal of each DFF in the plurality of DFFs; and
    a control terminal of the clock switch circuit is coupled to the external reset signal.

11. The method of claim 8, wherein the clock switch circuit is in the off state so that the clock signal is not output to the plurality of DFFs in response to the external reset signal being enabled, and in the on state so that the clock signal is output to the plurality of DFFs in response to the external reset signal being disabled.

12. The method of claim 8, wherein the external reset signal is coupled to the reset terminal of each DFF in the plurality of DFFs.

13. The method of claim 12, wherein each DFF is set in a reset mode and in a standby mode in response to the external reset signal being enabled and disabled, respectively.

14. The method of claim 8, wherein the predefined number of clock signal cycles is dependent on a total number of DFFs.

15. An electronic system comprising a local divider reset (LORST) circuitry configured to:
   receive a clock signal through a clock switch circuit;
   enable an internal reset signal through a plurality of serially coupled D flip-flops (DFFs) in response to an external reset signal being enabled; and
   disable the internal reset signal through the plurality of serially coupled DFFs after a predefined number of clock signal cycles after the external reset signal is disabled, wherein
     the clock switch circuit outputs the clock signal in an on state and blocks the clock signal in an off state, and
     the plurality of serially coupled DFFs are coupled to the clock switch circuit and driven by the clock signal output from the clock switch circuit, wherein
     each of the plurality of serially coupled DFFs includes a data input terminal, a data output terminal, a clock input terminal, and a reset terminal, and the data output terminal of one of two adjacent coupled DFFs is coupled to the data input terminal of the other one of the two adjacent coupled DFFs.

16. The electronic system of claim 15, wherein:
   the data input terminal of a first DFF in the plurality of DFFs is coupled to a logic voltage at which the internal reset signal is enabled; and
   an inverse data output terminal of a last DFF in the plurality of DFFs is coupled to the internal reset signal.

17. The electronic system of claim 15, wherein:
   an input terminal of the clock switch circuit is coupled to the clock signal;
   an output terminal of the clock switch circuit is coupled to the clock input terminal of each DFF in the plurality of DFFs; and
   a control terminal of the clock switch circuit is coupled to the external reset signal.

18. The electronic system of claim 15, wherein the clock switch circuit is in the off state so that the clock signal is not output to the plurality of DFFs in response to the external reset signal being enabled, and in the on state so that the clock signal is output to the plurality of DFFs in response to the external reset signal being disabled.

19. The electronic system of claim 15, wherein the external reset signal is coupled to a reset terminal of each DFF in the plurality of DFFs, so that each DFF is set in a reset mode and in a standby mode in response to the external reset signal being enabled and disabled, respectively.

20. The electronic system of claim 15, wherein the predefined number of clock signal cycles is dependent on a total number of DFFs.

* * * * *